United States Patent [19]

Sakarya

[11] 4,264,982
[45] Apr. 28, 1981

[54] DRIVE CIRCUIT FOR AN INFRARED REMOTE CONTROL TRANSMITTER

[75] Inventor: Dursun Sakarya, Indianapolis, Ind.

[73] Assignee: RCA Corporation, New York, N.Y.

[21] Appl. No.: 25,165

[22] Filed: Mar. 29, 1979

[51] Int. Cl.³ .......................... H04N 5/00; H04B 9/00
[52] U.S. Cl. .................................. 455/603; 358/194.1
[58] Field of Search ............ 250/199; 358/194, 194.1;
332/7.51; 331/94.5 H, 94.5 S, 94.5 M; 307/312

[56] References Cited

U.S. PATENT DOCUMENTS

| | | | |
|---|---|---|---|
| 3,577,017 | 5/1971 | Duke et al. | 307/312 |
| 3,648,073 | 3/1972 | Sams et al. | 307/312 |
| 3,794,841 | 2/1974 | Cosentino et al. | 250/199 |
| 3,984,705 | 10/1976 | George | 310/8.1 |
| 4,027,280 | 5/1977 | Beyers, Jr. | 340/15 |
| 4,044,297 | 8/1977 | Nobue et al. | 323/4 |
| 4,158,151 | 6/1979 | Grundler | 307/312 |

OTHER PUBLICATIONS

Brown et al., Avalanche Transistors Drive Laser Diodes Hard and Fast–Electronics, Nov. 14, 1966, pp. 137-139.
Vanderwall et al., Subnanosecond Rise Time Pulses From Injection Lasers–IEEE Jour. Quantum Elect. Jul. 1974, pp. 570, 571.
AGG–Telefunken Product Description–Integrated Circuits for Perpheric TV Functions–IR–Remote Control U321M Dec. 1977.
AMI–Advanced Product Description 52600/52601 Encoder–Decoder Remote Control 2–Chip Set, Jan. 1978.

Primary Examiner—Robert L. Griffin
Assistant Examiner—Joseph A. Orsino, Jr.
Attorney, Agent, or Firm—Eugene M. Whitacre; Paul J. Rasmussen; Peter M. Emanuel

[57] ABSTRACT

An infrared remote control transmitter includes at least one infrared light-emitting diode poled with respect to a point of reference potential so as to be conductive in response to voltages having the opposite polarity of a DC supply voltage and to be nonconductive in response to voltages having the same polarity as the DC supply voltage. A push-pull amplifier is responsive to a pulse signal encoded to represent a remote control message to selectively couple the DC supply voltage or the reference potential to a capacitor coupled in series between the push-pull amplifier and the light-emitting diode. The capacitor is charged and discharged and an alternating drive voltage for the light-emitting diode having portions with polarities both the same as and opposite to the polarity of the DC supply voltage is generated. The push-pull amplifier is arranged so that when a component failure occurs, the portions of the alternating drive voltage having the polarity opposite to the polarity of the DC supply voltage are at least inhibited to prevent the continuous (i.e., DC) emission of infrared radiation.

6 Claims, 1 Drawing Figure

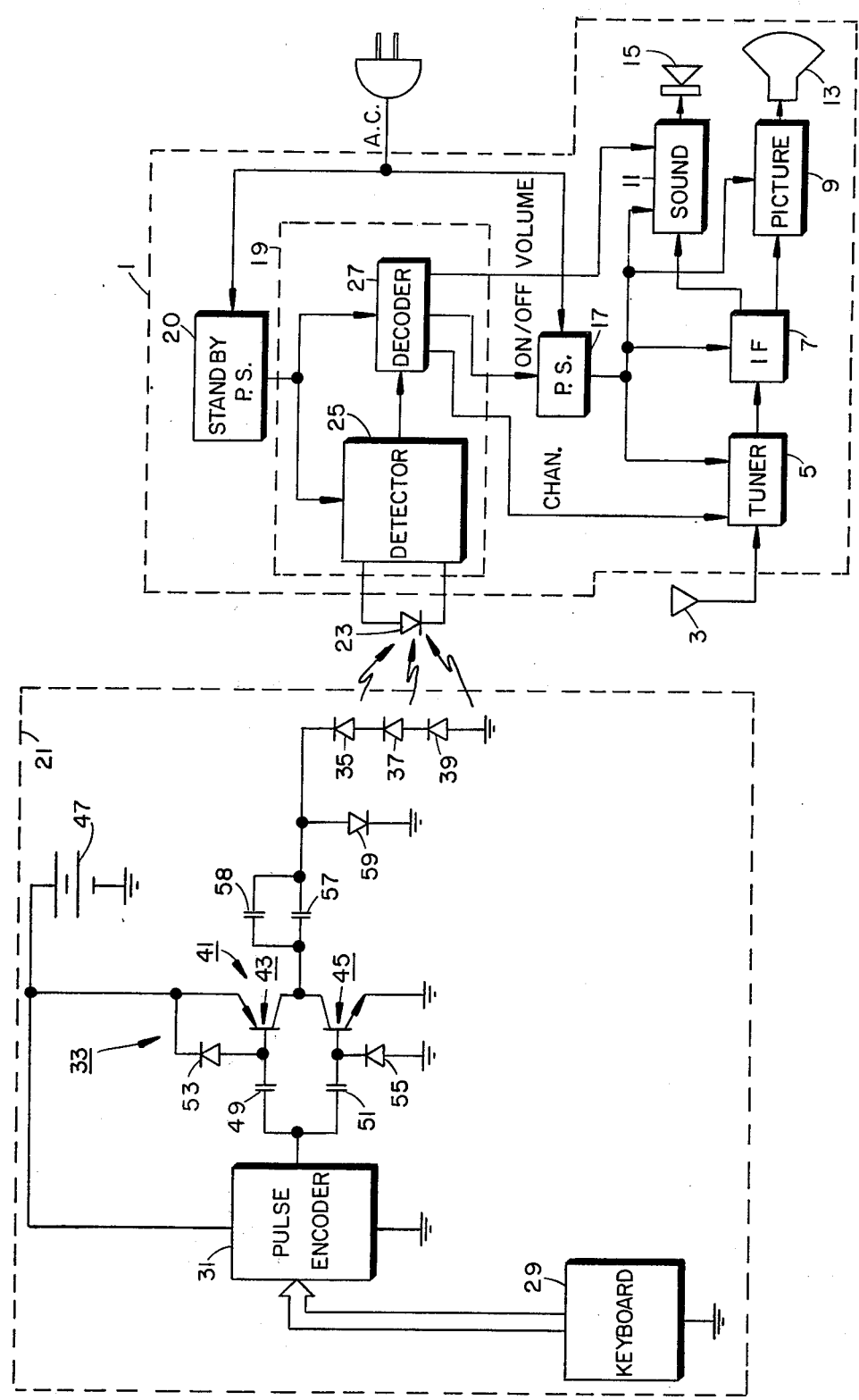

DRIVE CIRCUIT FOR AN INFRARED REMOTE CONTROL TRANSMITTER

BACKGROUND OF THE PRESENT INVENTION

The present invention relates to drive circuits for infrared remote control transmitters.

Infrared remote control systems for television receivers and the like are known. The chief advantage of infrared remote control systems in comparison to ultrasonic remote control systems is that they are less susceptible to erroneously-generated interference signals. Unfortunately, the human eye may be harmed under conditions of prolonged, continuous and direct exposure to infrared radiation.

In order to reduce the possibility of harm to the eyes of users, infrared remote control systems utilize special pulse codes which minimize the duration of infrared radiation during the transmission of remote controlled messages. However, since in conventional drive circuits for infrared remote control transmitters the infrared light source, e.g., a light-emitting diode or diodes, is typically included in a direct current path from a supply voltage, infrared radiation may be continuously emitted should there be a component failure in the remote control transmitter. Therefore, there is a requirement for drive circuits for use in infrared remote control transmitters in which component failures do not result in the continuous emission of infrared radiation. The present invention concerns such a "fail-safe" drive circuit.

SUMMARY OF THE PRESENT INVENTION

In a remote control transmitter, at least one infrared light-emitting diode is coupled to a point of reference potential and poled so as to be substantially nonconductive in response to voltages having the same polarity as a DC supply voltage for the transmitter and substantially conductive in response to voltages having the polarity opposite to the polarity of the DC supply voltage. Driver means responsive to an input signal is coupled between the source of the DC supply voltage and the light-emitting diode. The driver means normally generates an alternating drive voltage for the light-emitting diode having portions with polarities both the same as and opposite to the polarity of the DC supply voltage. The driver means is arranged so that the portions of the drive signal having the polarity opposite to that of the DC supply voltage are at least inhibited when a component failure occurs.

BRIEF DESCRIPTION OF THE DRAWING

The sole FIGURE of the drawing shows, partially in block diagram form and partially in schematic diagram form, an infrared remote control system constructed in accordance with the present invention as it may be employed in a television receiver arrangement.

DETAILED DESCRIPTION OF THE DRAWING

A television receiver 1 includes an antenna 3, a tuner 5, an IF signal processing unit 7, a picture signal processing unit 9, a sound signal processing unit 11, a picture tube 13 and a speaker 15 arranged in a conventional fashion to produce visual and audio responses. A power supply 17 is selectively energized to generate DC supply voltages for the portions of the receiver so far described from the AC line voltage in response to an ON/OFF control signal generated by a remote control receiver 19. Receiver 1 also includes a standby power supply 20 which continuously couples a DC supply voltage to remote control receiver 19 so that it is ready to accept messages from a remote control transmitter 21.

Remote control receiver 19 includes a photosensitive diode 23. The conduction of photo diode 23 is controlled in response to encoded optical signals having frequencies in the infrared range generated by remote control transmitter 21. A detector 25 senses the changes in the conduction of diode 23 and generates electrical signals corresponding to the encoded optical signals. The electrical signals are decoded by a decoder 27 to generate the ON/OFF control signal for tuning receiver 1 on and off, a CHANNEL SELECTION control signal for controlling the frequency to which a tuner 5 is tuned, and a VOLUME control signal for controlling the sound level of receiver 1.

Remote control transmitter 21 includes a keyboard 29 including push buttons (not shown) by which a user may control the various receiver functions enumerated above. When a push button is depressed a corresponding electrical signal is generated by keyboard 29. A pulse encoder 31 is responsive to these electrical signals to generate respective coded pulse signals. The coded pulse signals are processed by a driver 33 to cause infrared light-emitting diodes 35, 37 and 39 to generate corresponding optical signals in the infrared frequency range.

Various codes for infrared remote control systems and encoders and decoders for these codes are known. For example, encoder 31 and decoder 27 may comprise S2600 and S2601 integrated circuits manufactured by American Microsystems, Inc. of Santa Clara, Calif.

The exact nature of the codes is not directly germane to the present invention. However, it is desirable for the reasons of safety discussed earlier that the code formats are arranged so that the duration of infrared radiation during a transmission is minimized. Since the pulses of the pulse signals generated by pulse encoder 31 correspond to the intervals of infrared radiation, this may be accomplished by causing the electrical pulse signals generated by encoder 31 to have a relatively low duty cycle, e.g., less than 20 percent. In addition, for safety reasons, it is desirable that light-emitting diodes 35, 37 and 39 be physically separated on transmitter 21 from one another by a distance selected so that the power of the infrared radiation they generate is distributed rather than concentrated in a relatively small area.

While these safety precautions to some extent minimize the danger to users, they do not account for component failures which may cause the continuous, i.e., DC, emission of infrared radiation. Unfortunately, the human eye may be injured when directly exposed to continuous infrared radiation for prolonged periods. While such situations are extremely rare, since they would involve not only a component failure but the misuse of the transmitter, they may occur under extraordinary circumstances. For example, a curious child may point an infrared transmitter with a failed component directly into his eye.

Drive circuit 33 is arranged to prevent the continuous emission of infrared radiation under any foreseeable component failure mode. Driver 33 includes a push-pull amplifier 41 comprising a PNP transistor 43 and an NPN transistor 45 having their collector-emitter junctions coupled in series between a battery 47 and signal ground. Battery 47 is the source of DC supply voltage for transmitter 21. The output of pulse encoder 31 is coupled to the bases of transistors 43 and 45 through capacitors 49 and 51, respectively. Diodes 53 and 55 are coupled in shunt with the base-emitter junctions of transistors 43 and 45, respectively. The junction of the collectors of transistors 43 and 45 is coupled through parallel connected capacitors 57 and 58 to the cathode of light-emitting diode 35. Light-emitting diodes 35, 37 and 39 are connected in series with the same polarity between capacitors 57 and 58 and signal ground. The polarity of light-emitting diodes 35, 37 and 39 is selected so that they are rendered nonconductive in response to the application of voltages to the cathode of light-emitting diode 35 having the same polarity (i.e., positive) with respect to signal ground as the DC supply voltage provided by battery 47 and only rendered conductive in response to the application of voltages having the opposite polarity (i.e., negative) with respect to signal ground to the DC supply voltage. A diode 59 is connected in shunt with series connected light-emitting diodes 35, 37 and 39 and poled in the opposite direction.

In operation, pulse encoder 31 generates a pulse signal encoded as described above. The pulse signal includes positive-going pulses. In response to the leading edges of the positive-going pulses, transistor 45 is rendered conductive. In response to the trailing edges of the positive-going pulses, transistor 43 is rendered conductive. Diodes 53 and 55 serve as discharge paths for capacitors 49 and 51 during the intervals when transistors 43 and 45, respectively, are nonconductive. Diodes 53 and 55 also clamp the voltage at the bases of transistors 43 and 45 close to the battery voltage and the voltage at signal ground, respectively, in order to protect the base-emitter junctions of transistors 43 and 45 from reverse breakdown failure voltages. Desirably, capacitors 49 and 51 have relatively small values so that capacitors 49 and 51 are charged and discharged in response to each pulse. As a result, transistors 43 and 45 are alternately rendered conductive and nonconductive in response to each pulse of the pulse signal.

When transistor 43 is conductive (and transistor 45 is nonconductive) capacitors 57 and 58 are charged from battery 47. When transistor 45 is conductive (and transistor 43 is nonconductive) capacitors 57 and 58 are discharged to signal ground. As a result, an alternating drive voltage, i.e., one having polarity excursions above and below the potential at signal ground, are generated at the cathode of light-emitting diode 35. Light-emitting diodes are conductive in response to the negative portions of the drive voltage and are nonconductive in response to the positive portions of the drive voltage. Diodes 35, 37 and 39 only emit infrared radiation when they are conductive. Therefore, infrared radiation is only emitted by transmitter 21 when the drive voltage has a polarity (i.e., negative opposite to the polarity of the DC supply voltage.

Desirably, the capacitance of the combination of capacitors 57 and 58 is relatively large, e.g., 1 microfarad, so that sufficient drive current is provided to light-emitting diodes 35, 37 and 39 to cause them to emit infrared radiation. For the same reason, two capacitors rather than one are used, since the effective series resistance associated with the parallel combination is smaller than the series resistance of a single capacitor.

In the event that there is a component failure within drive circuit 33, drive voltage developed at the cathode of light-emitting diode 35 will be reduced and, in most cases, substantially inhibited. Under these conditions, since the amplitude of the negative portions of the drive signal will at least have a lower than normal amplitude, the infrared radiation will have a lower than normal energy.

Briefly, any failure of a component within driver 33 causing the component to open or short, substantially prevents the development of an alternating drive signal at the cathode of light-emitting diode 35. Since diodes 35, 37 and 39 are rendered conductive only in response to negative-going voltages, no infrared radiation is generated. Any component failure between the extremes of an open or short causes a reduction in the amplitude of the alternating drive signal. By way of example, consider the following failure modes. If either transistor 43 or 45 fails, e.g., by shorting from collector to emitter, capacitors 57 and 58 will be either permanently charged or discharged, thereby preventing the development of an alternating drive signal. If one of capacitors 57 and 58 shorts, only positive-going voltages are developed at the cathode of light-emitting diode 35. If the collector to emitter junction of transistor 43 and one of capacitors 57 and 58 short, a DC signal is coupled to the cathode of light-emitting diode 35, thereby rendering diode 59 conductive and preventing light-emitting diodes 35, 37 and 39 from being rendered conductive. If diode 59 opens, capacitors 57 and 58 will not be charged thereby preventing the development of an alternating voltage at the cathode of diode 35. If diode 59 fails so as to lose its unidirectional conductive characteristics, i.e., in essence becomes a passive element, an alternating drive signal will be developed but it will have a lower than normal amplitude. Furthermore, failures in pulse encoder 31 causing generation of a DC signal rather than a pulse signal will also cause the loss of an alternating drive signal.

Driver circuit 33 may be modified in some respects without causing the loss of its "fail-safe" nature. For example, any or all of diodes 53, 55 and 59 may be replaced with resistors. While this modification causes a reduction in efficiency of the normal operation of drive circuit 33, it does not alter its "fail-safe" nature. These and other modifications are intended to be within the scope of the present invention as set forth in the following claims.

What is claimed is:

1. In an infrared remote control transmitter for controlling a television system, apparatus comprising:
   a reference circuit point for receiving a reference potential;
   a supply circuit point for receiving a DC supply voltage;
   a battery connected with a predetermined polarity connected between said supply and reference circuit points;
   at least one light-emitting diode for emitting infrared radiation when rendered conductive, said light emitting diode having a cathode and an anode, one of said cathode and anode being connected to said reference circuit point, said light-emitting diode being poled with respect to said reference circuit point so as to be conductive in response to the application of a voltage to the other one of said cathode and anode having the opposite polarity to said battery with respect to said reference circuit point and non-conductive in response to the application of a voltage to said other one of said cathode and anode having the same polarity as said battery with respect to said reference circuit point;

a source circuit point for receiving an input signal having pulses encoded to represent information for controlling a predetermined function of said television receiver;

a drive circuit point;

a capacitor directly connected between said drive circuit point and said other one of said cathode and anode;

a diode directly connected between said other one of said cathode and anode and said reference circuit point and poled in the opposite sense to said light-emitting diode with respect to said reference circuit point;

push-pull amplifier means for developing a drive voltage at said drive point including first and second bipolar transistors of opposite conduction types, each of said transistors having a collector-emitter path and a base electrode for controlling the conduction of said collector-emitter path, said collector-emitter path of said first transistor being directly connected between said supply circuit point and said drive circuit point, said collector-emitter path of said second transistor being connected between said drive circuit point and said reference point; and input means coupled between said source circuit point and said bases of said first and second transistors for rendering said collector-emitter path of said first transistor conductive and said collector-emitter path of said second transistor non-conductive in response to a first portion of said pulses of said input signal and for rendering said collector-emitter path of said second transistor conductive and said collector-emitter path of said first transistor non-conductive in response to a second portion of said pulses of said input signal.

2. The apparatus recited in claim 1 wherein:

three light-emitting diodes poled in the same direction are connected in series between said capacitor means and said reference circuit point.

3. The apparatus recited in claim 1 wherein:

a second capacitor is directly connected between said drive point and said other one of said cathode and anode in parallel with said first mentioned capacitor directly connected between said drive point and said other one of said cathode and anode.

4. The apparatus recited in claim 1 wherein:

said input means includes a first capacitor connected between said source circuit point and said base of said first transistor; first means connected between said supply circuit point and said base of said first transistor for discharging said first capacitor; a second capacitor connected between said source circuit point and said base of said second transistor; and second means connected between said base of said second transistor and said reference circuit point for discharging said second capacitor.

5. The apparatus recited in claim 4 wherein:

said first means includes a further diode poled to be conductive when said collector-emitter path of said first transistor is non-conductive and non-conductive when said collector-emitter path of said first transistor is conductive; and said second means includes a still further diode poled to be conductive when said collector-emitter path of said second transistor is non-conductive and non-conductive when said collector-emitter path of said second transistor is conductive.

6. In an infrared remote control transmitter for controlling a television system, apparatus comprising:

a reference circuit point for receiving a reference potential;

a supply circuit point for receiving a DC supply voltage;

a battery connected with a predetermined polarity connected between said supply and reference circuit points;

three light-emitting diodes which emit infrared radiation when rendered conductive directly connected in series between a voltage application circuit point and said reference circuit point, all of said light-emitting diodes being poled with respect to said reference circuit point so as to be conductive in response to the application of a voltage to said voltage application circuit point having the opposite polarity to said battery with respect to said reference circuit point and non-conductive in response to the application of a voltage to said voltage application circuit point having the same polarity as said battery with respect to said reference circuit point;

a source circuit point for receiving an input signal having pulses encoded to represent information for controlling a predetermined function of said television receiver;

a drive circuit point;

a first capacitor directly connected between said drive circuit point and said voltage application circuit point;

a second capacitor directly connected between said drive circuit point and said voltage application circuit point;

a diode directly connected between said voltage application circuit point and said reference circuit point and poled in the opposite sense to said light-emitting diode with respect to said reference circuit point;

push-pull amplifier means for developing a drive voltage at said drive point including first and second bipolar transistors of opposite conduction types, each of said transistors having a collector-emitter path and a base electrode for controlling the conduction of said collector-emitter path, said collector-emitter path of said first transistor being directly connected between said supply circuit point and said drive circuit point, said collector-emitter path of said second transistor being connected between said drive circuit point and said reference point; and input means coupled between said source circuit point and said bases of said first and second transistors for rendering said collector-emitter path of said first transistor conductive and said collector-emitter path of said second transistor non-conductive in response to a first portion of said pulses of said input signal and for rendering said collector-emitter path of said second transistor conductive and said collector-emitter path of said first transistor non-conductive in response to a second portion of said pulses of said input signal.

* * * * *